(12) United States Patent
Yamamoto et al.

(10) Patent No.: US 6,645,883 B2
(45) Date of Patent: Nov. 11, 2003

(54) FILM FORMING METHOD, SEMICONDUCTOR DEVICE AND MANUFACTURING METHOD OF THE SAME

(75) Inventors: Youichi Yamamoto, Tokyo (JP); Hiroshi Ikakura, Tokyo (JP); Tomomi Suzuki, Tokyo (JP); Yuichiro Kotake, Tokyo (JP); Yoshimi Shioya, Tokyo (JP); Kouichi Ohira, Tokyo (JP); Shoji Ohgawara, Tokyo (JP); Kazuo Maeda, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 09/863,382

(22) Filed: May 24, 2001

(65) Prior Publication Data

US 2002/0013068 A1 Jan. 31, 2002

(30) Foreign Application Priority Data

Jun. 22, 2000 (JP) ......................................... 2000-188287

(51) Int. Cl.[7] ......................... H01L 21/31; H01L 21/469
(52) U.S. Cl. ........................................ 438/788; 438/789
(58) Field of Search ................................. 438/787, 788, 438/789

(56) References Cited

FOREIGN PATENT DOCUMENTS

| DE | 196 54 737 A1 | 12/1996 | |
|---|---|---|---|
| EP | 0 299 754 | * 1/1989 | ........... C23C/16/40 |
| EP | 0 664 560 A2 | 1/1995 | |
| EP | 0 881 678 A2 | 5/1998 | |
| EP | 1 113 489 A2 | 12/2000 | |
| EP | 1 148 539 A2 | 4/2001 | |
| JP | 11-288931 | 10/1999 | |
| WO | 98/50945 | 5/1998 | |
| WO | 99/41423 | 2/1999 | |

* cited by examiner

*Primary Examiner*—Alexander Ghyka
(74) *Attorney, Agent, or Firm*—Lorusso, Loud & Kelly

(57) ABSTRACT

The present invention discloses a film forming method for forming an insulating film having a low dielectric constant. This method comprises the steps of adding at least one diluting gas of an inert gas and a nitrogen gas ($N_2$) to a major deposition gas component consisting of siloxane and $N_2O$, converting the resultant deposition gas into plasma, causing reaction in the plasma, and forming an insulating film 25,27, or 28 on a substrate targeted for film formation.

14 Claims, 10 Drawing Sheets

① Siloxane

② $H_2O$

③ Ar, He or $H_2$

FILM FORMING METHOD, SEMICONDUCTOR DEVICE AND MANUFACTURING METHOD OF THE SAME

BACKGROUND OF THE INVENTION

1. Field of the Invention

The present invention relates to a film forming method used to form an insulating film having a low dielectric constant, a semiconductor device, and a manufacturing method of the same.

2. Description of Prior Art

With regard to a semiconductor integrated circuit device, requests have been made in recent years to achieve not only a higher integration and a higher density but also a higher data transfer speed. Thus, efforts have been actively made to develop an insulating film having a low dielectric constant with a small RC delay (referred to as a low dielectric-constant insulating film, hereinafter).

For the formation of such a low dielectric-constant insulating film, a plasma enhanced chemical vapor deposition method (hereinafter, referred to as PE-CVD method) is known, which uses, as a source gas, a deposition gas consisting of methylsilane ($Si(CH_3)_4$, $SiH(CH_3)_3$, $CH_3SiH_3$ or the like) and nitrogen monoxide ($N_2O$), or a deposition gas consisting of hexamethyldisiloxane (HMDSO) and nitrogen monoxide ($N_2O$).

However, there is an inherent problem in such a conventional method. That is, it is difficult to form a low dielectric-constant insulating film in a stable manner by use of the above deposition gases, the film having, for example, a relative dielectric constant of about 2.7.

Namely, an attempt to reduce the relative dielectric constant creates a problem of a rough surface of the low dielectric-constant insulating film. In addition, an attempt to form a film having a thickness of 2 μm or more creates a problem of cracks in a formed film.

SUMMARY OF THE INVENTION

It is an object of the present invention to provide a film forming method, which enables an insulating film to be formed with a low relative dielectric constant about 2.7 or lower while preventing the surface roughness of the insulating film or the generation of cracks in the thick insulating film. Moreover, it is also the object of the present invention to provide a semiconductor device, and a manufacturing method of the same.

The inventors of the present invention made an experiment on two kinds of insulating films formed by PE-CVD, i.e., one formed by use of deposition gas obtained by adding Ar, He or $N_2$ to a major deposition gas component consisting of siloxane and $N_2O$, and then diluting the same, and the other formed by use of a deposition gas consisting of only siloxane and $N_2O$. According to the experiment, as can be understood from FIGS. 3A and 3B or FIGS. 4A and 4B, compared with the latter insulating film, the former insulating film had a great reduction in the surface roughness thereof, and great suppression of the generation of cracks therein.

For use as an alkyl compound containing a siloxane bonding, one can be selected from hexamethyldisiloxane (HMDSO: $(CH_3)_3Si—O—Si(CH_3)_3$), octamethylcyclotetrasiloxane (OMCTS), and tetramethylcyclotetrasiloxane (TMCTS), the second being represented by a chemical formula 3 below, and the third by a chemical formula 4 below.

[Chemical Formula 3]

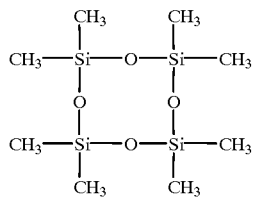

[Chemical Formula 4]

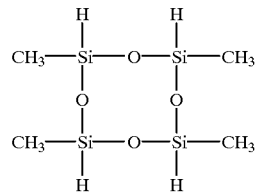

DESCRIPTION OF THE PREFERRED EMBODIMENT

Next, description will be made for the preferred embodiment of the present invention with reference to the accompanying drawings.

Figure 1:
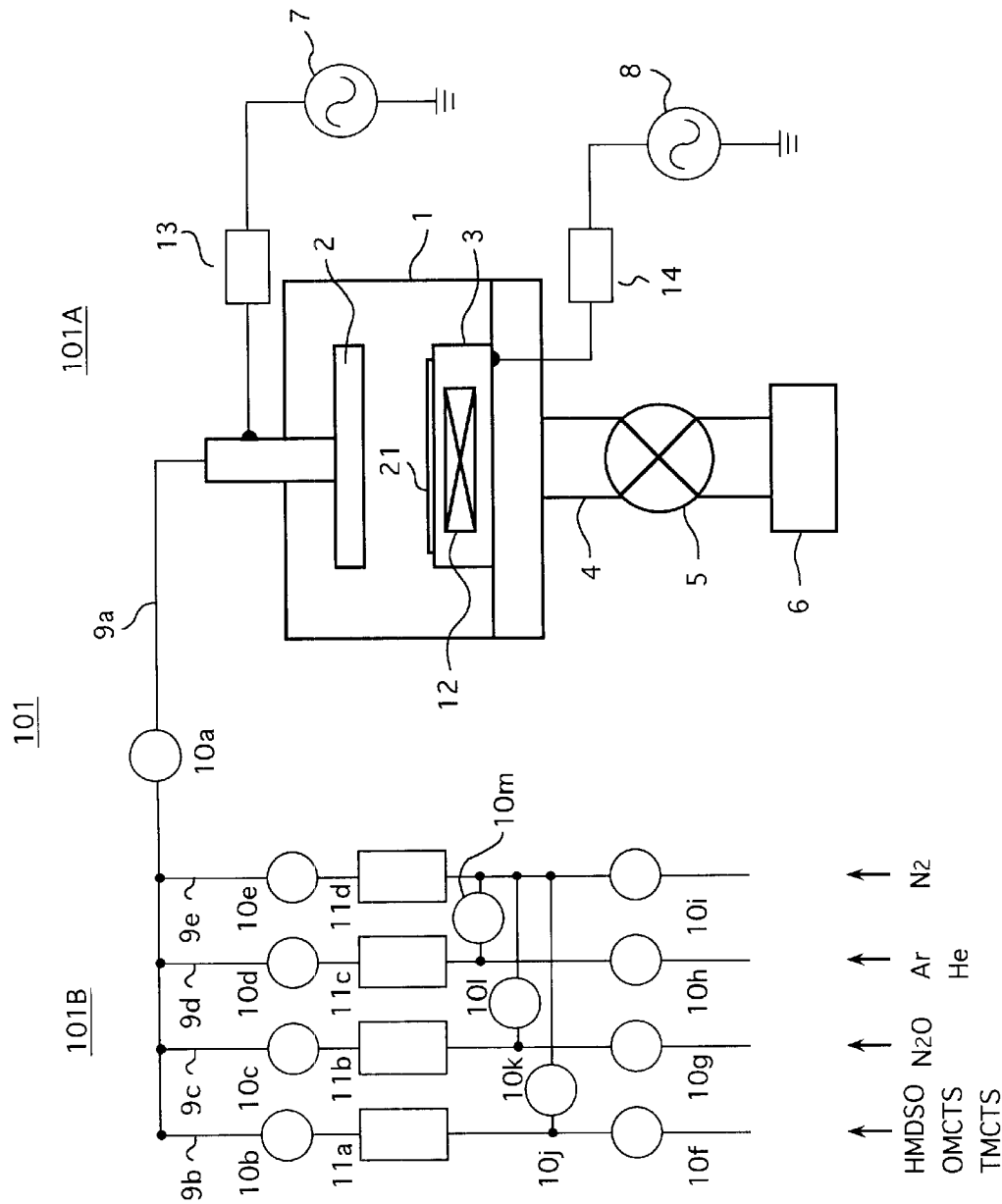
FIG. 1 is a side view showing a constitution of a plasma enhanced CVD apparatus used for a film forming method according to an embodiment of the invention.

FIG. 1 is a side view showing the constitution of a parallel-plate plasma enhanced CVD apparatus 101 used for a manufacturing method of a semiconductor device according to an embodiment of the present invention. This plasma enhanced CVD apparatus 101 comprises: a film forming section 101A for forming an insulating film, especially an insulating film having a low dielectric constant, on a substrate 21 which is targeted for film formation by a plasma gas; and a deposition gas supply section 101B having a plurality of gas supplies for composing a deposition gas.

As shown in FIG. 1, the film forming section 101A includes a chamber 1 capable of reducing pressure, which is connected through an exhaust pipe 4 to an exhaust device 6. In the midway of the exhaust pipe 4, an opening/closing valve 5 is provided to control communication/non-communication between the chamber 1 and the exhaust device 6. The chamber 1 includes pressure measuring means (not shown) such as a vacuum gauge to monitor the pressure therein.

The chamber 1 also includes a pair of upper and lower electrodes (first and second electrodes) 2 and 3 placed oppositely to each other. The upper electrode 2 is connected through an impedance matching box 13 to a high-frequency power source (RF power source) 7, which supplies high-frequency power having a frequency of 13.56 MHz. The lower electrode 3 is connected through an impedance matching box 14 to a low-frequency power source 8, which supplies low-frequency power having a frequency of 380 kHz. Electric power is supplied to the upper and lower electrodes 2 and 3 from these power sources 7 and 8, to convert the deposition gas into plasma. The upper and lower electrodes 2 and 3 and the power sources 7 and 8 thus constitute plasma generating means for converting the deposition gas into plasma. A space between the upper and lower electrodes 2 and 3 is one of the important parameters to decide a characteristic of an insulating film. Especially, in order to form a denser insulating film, the space should preferably be set equal to or more than a thickness of the substrate, and equal to or lower than 30 mm.

Not only the power of a frequency of 380 kHz but also low-frequency power having a frequency ranging from 100 kHz to 1 MHz can be applied to the lower electrode 3. Not only the power of a frequency of 13.56 MHz but also high-frequency power having a frequency of 1 MHz or higher may be applied to the upper electrode 2 placed oppositely to the lower electrode 3.

The upper electrode 2 also serves as a deposition gas dispersion tool. A plurality of through-holes are formed in the upper electrode 2, and at the surface of the upper electrode 2 which faces the opposite lower electrode 3, openings of the through-holes form outlets (inlets) for the deposition gas. The outlet of deposition gas or the like is connected through a pipe 9a to the deposition gas supply section 101B. In addition, as occasion demands, a heater (not shown) may be provided in the upper electrode 2. The heater can heat the upper electrode 2 up to a temperature of about 100° C. during film formation to prevent particles of reaction product of the deposition gas or the like from being stuck to the upper electrode 2.

The lower electrode 3 also serves as a loading base for the substrate 21 targeted for film formation, and includes a heater 12 provided to heat the substrate 21 on the holding base.

The deposition gas supply section 101B includes: a supply of siloxane such as hexamethyldisiloxane (HMDSO: $(CH_3)_3Si—O—Si(CH_3)_3$); a supply of nitrogen monoxide ($N_2O$); a supply of argon (Ar) or helium (He), which is an inert gas for dilution; and a supply of nitrogen ($N_2$) for dilution and purging.

Such gases are supplied through each of branch pipes 9b to 9e and through the pipe 9a, to which the pipes 9b to 9e are all connected, into the chamber 1 of the film forming section 101A appropriately. In the midways of the branch pipes 9b to 9e, flow rate control means 11a to 11d, and opening/closing means 10b to 10e for controlling opening/closing of the branch pipes 9b to 9e are installed. In the midway of the pipe 9a, opening/closing means 10a is installed to close the pipe 9a or set the pipe 9a to be conductive. In addition, to distribute $N_2$ gas and to purge gases remaining in the branch pipes 9b to 9d, opening/closing means 10j to 10m are installed for controlling communication/non-communication between the branch pipe 9e connected to the supply of $N_2$ gas and the other branch pipes 9b to 9d. Note that, $N_2$ gas is used not only for purging in the branch pipes 9b to 9d but also for purging of gases remaining in the pipe 9a and the chamber 1. Also, $N_2$ gas is used as a dilution gas to dilute the deposition gas.

With regard to siloxane, which is a major component gas of the deposition gas, to which the present invention is applied, one from the following typical examples can be selected for use:

(i) hexamethyldisiloxane (HMDSO: $(CH_3)_3Si—O—Si(CH_3)_3$);

(ii) octamethylcyclotetrasiloxane (OMCTS); and (iii) tetramethylcyclotetrasiloxane (TMCTS), (ii) being represented by a chemical formula 5 below, and (iii) by a chemical formula 6 below.

[Chemical Formula 5]

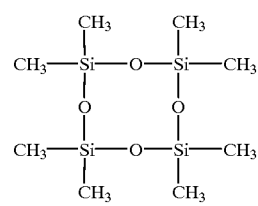

[Chemical Formula 6]

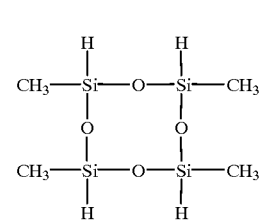

According to the above mentioned film forming apparatus 101, the gas supplies are provided, each of which supplies: siloxane such as hexamethyldisiloxane (HMDSO) or the like; nitrogen monoxide ($N_2O$); argon (Ar) or helium (He), which is an inert gas for dilution; and nitrogen ($N_2$) for dilution and purging, and further, the plasma generating means 2, 3, 7 and 8 for converting the deposition gas into plasma are provided.

An insulating film formed by use of this CVD apparatus and based on a plasma enhanced chemical vapor deposition method (PE-CVD method) using a deposition gas containing siloxane and nitrogen monoxide ($N_2O$) contains $CH_3$. Accordingly, it is possible to form a denser insulating film having a low dielectric constant.

According to the experiment, in addition to the use of major gas components constituted of siloxane and nitrogen monoxide ($N_2O$) for film formation, these major gas components are advantageously diluted by argon (Ar), helium (He) or nitrogen ($N_2$), which is an inert gas. This can prevent the surface roughness of a formed film and generation of cracks in the film can be suppressed.

In addition, the power sources 7 and 8 for supplying electric power of two kinds of frequencies, high and low, are respectively connected to the parallel-plate first and second electrodes 2 and 3 among the plasma generating means. Accordingly, it is possible to generate plasma by applying power of the two kinds of frequencies, high and low, respectively to the electrodes 2 and 3. Especially, an insulating film formed in this way is much denser.

Note that, as plasma generating means, other than the means for generating plasma by the parallel-plate first and second electrodes 2 and 3, for example, means for generating plasma by an electron cyclotron resonance (ECR) method, means for generating helicon plasma by the radiation of high-frequency power from an antenna, or the like can be used.

Next, description will be made for the film forming method according to the embodiment of the present invention using the foregoing gas, and also characteristics of the film formed by this method, which includes a surface state, a relative dielectric constant, and so on.

Figure 2:
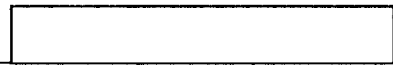
FIG. 2 is a timing chart showing introduction of a deposition gas into a chamber of the plasma enhanced CVD apparatus, the deposition gas being used for the film forming method according to the embodiment of the present invention.
Figure 2:
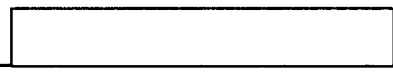
Figure 2:
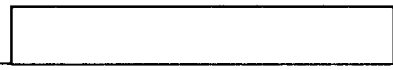

FIG. 2 is a timing chart regarding a method for forming a film by use of siloxane, nitrogen monoxide ($N_2O$), and argon (Ar), helium (He) or nitrogen ($N_2$), which is an inert gas for dilution.

Figure 8A:
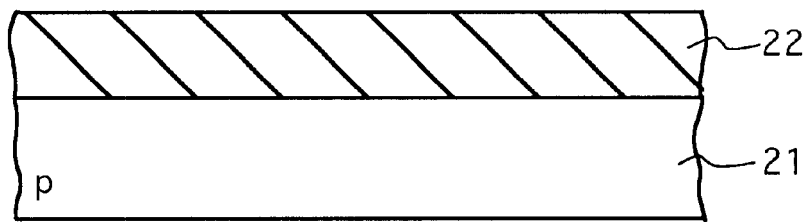
FIGS. 8A and 8B are sectional views, each showing a constitution of a sample used for investigating characteristics of the insulating film formed by the film forming method of the embodiment of the present invention.
Figure 8B:
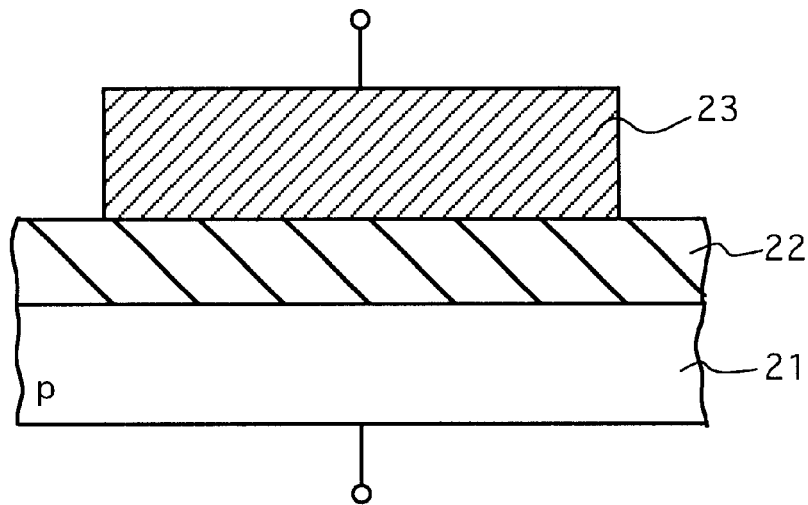

FIG. 8A is a sectional view showing an insulating film having a low dielectric constant (may be referred to as a low dielectric-constant insulating film, hereinafter) formed on the substrate by use of the film forming method of the embodiment of the present invention, and based on the timing chart of FIG. 2; and FIG. 8B is a sectional view of a sample for investigating film characteristics, the sample being prepared by forming an electrode on the low dielectric-constant insulating film to measure a relative dielectric constant.

The low dielectric-constant insulting films are prepared by changing predetermined parameters (flow rate Z of the dilution gas, and pressure P of the deposition gas) for each of three kinds of dilution gases. Tables 1 to 3 below show the combinations of the three kinds of deposition gases with changed parameters. Other unchanged parameters for the deposition are also shown in the Tables. In addition, for comparison, inventors an insulating film is formed by use of a deposition gas of the same major deposition gas components but not containing dilution gases, and used this as a comparative sample.

Table 1 shows a film forming condition, where a parameter changed with regard to the deposition gas of HMDSO+ $N_2O$+Ar is an Ar flow rate Z. Investigation was performed at four points of the Ar flow rate Z including 0, 50, 100, and 150 sccm.

TABLE 1

| Film Forming Condition | |
|---|---|
| Deposition gas condition | |
| Deposition gas | HMDSO + $N_2O$ + Ar |
| Total flow rate | 250 sccm |
| Flow rate ratio of $N_2O$/HMDSO | 1.5 |
| Flow rate of Ar | Z sccm |
| Gas pressure | 0.9 Torr |
| Plasma generation condition | |
| RF power (frequency 13.56 MHz, applied to upper electrode) | 250 W |

Table 2 shows a film forming condition, where a parameter changed with regard to the deposition gas of HMDSO+ $N_2O$+He is a gas pressure P. Investigation was conducted at four points of the gas pressures P including 0.9, 1.1, 1.3, and 1.4 Torr.

TABLE 2

| Film Forming Condition | |
|---|---|
| Deposition gas condition | |
| Flow rate of HMDSO | 40 sccm |
| Flow rate of $N_2O$ | 60 sccm |
| Flow rate of He | 150 sccm |
| Gas pressure | P Torr |
| Plasma generation condition | |
| RF power (frequency 13.56 MHz, applied to upper electrode) | 250 W |

Table 3 shows a film forming condition, where a parameter changed with regard to the deposition gas of HMDSO+ $N_2O$+$N_2$ is a gas pressure P. Investigation was made at six points of the gas pressures P including 0.9, 1.0, 1.1, 1.2, 1.3, and 1.4 Torr.

TABLE 3

| Film Forming Condition | |
|---|---|
| Deposition gas condition | |
| Flow rate of HMDSO | 50 sccm |
| Flow rate of $N_2O$ | 200 sccm |
| Flow rate of $N_2$ | 200 sccm |
| Gas pressure | P Torr |
| Plasma generation condition | |
| RF power (frequency 13.56 MHz, applied to upper electrode) | 250 W |

First, a p-type silicon substrate (substrate targeted for film formation) 21 is carried into the chamber 1 of the plasma enhanced CVD apparatus of FIG. 1, and placed on the substrate loading base (lower electrode) 3.

Then, hexamethyldisiloxane (HMDSO) at a flow rate of X sccm, nitrogen monoxide ($N_2O$) at a flow rate of Y sccm, and argon (Ar), helium (He) or nitrogen ($N_2$), which is an inert gas for dilution, at a flow rate of Z sccm are introduced into the chamber 1, and the gas pressure in the chamber 1 is maintained at P Torr.

Subsequently, electric power of 250 W of a frequency of 13.56 MHz is applied to the upper electrode 2. Accordingly, the deposition gas receives energy to be converted into plasma. By maintaining this state for a predetermined time, as shown in FIG. 8A, a low dielectric-constant insulating film having a thickness of about 2.5 to 3.0 μm is formed on the silicon substrate 21. Note that, during the film formation, the substrate 21 targeted for film formation is heated to a temperature of 350 to 400° C., and held at this temperature.

By the foregoing process, a low dielectric-constant insulating film 22 is formed on the silicon substrate 21.

Next, an observation is performed with respect to the surface of the formed low dielectric-constant insulating film 22. The result thereof is shown in each of FIGS. 3A and 3B, and FIGS. 4A and 4B.

Figure 3A:
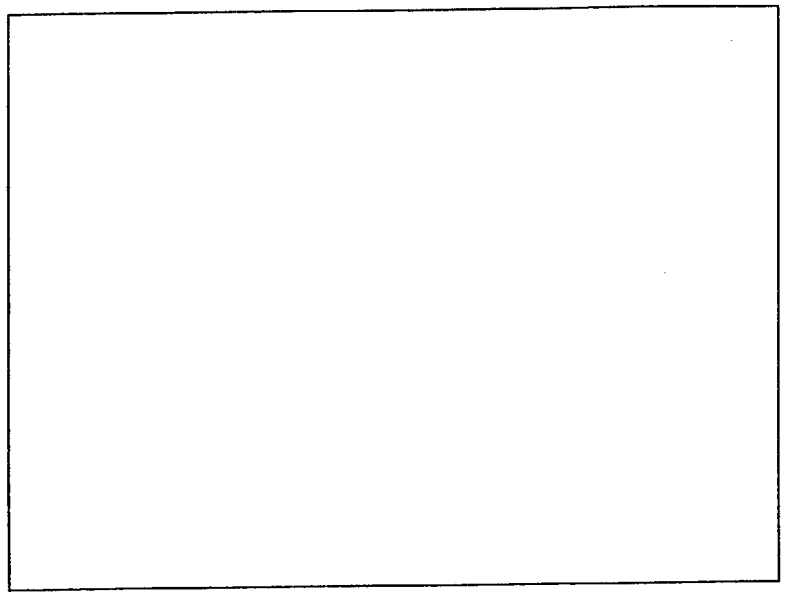
FIG. 3A is a photograph showing an observed surface of a low dielectric-constant insulating film 22 formed by the film forming method of this embodiment by use of a deposition gas consisting of HMDSO+$N_2O$+Ar.
Figure 3B:
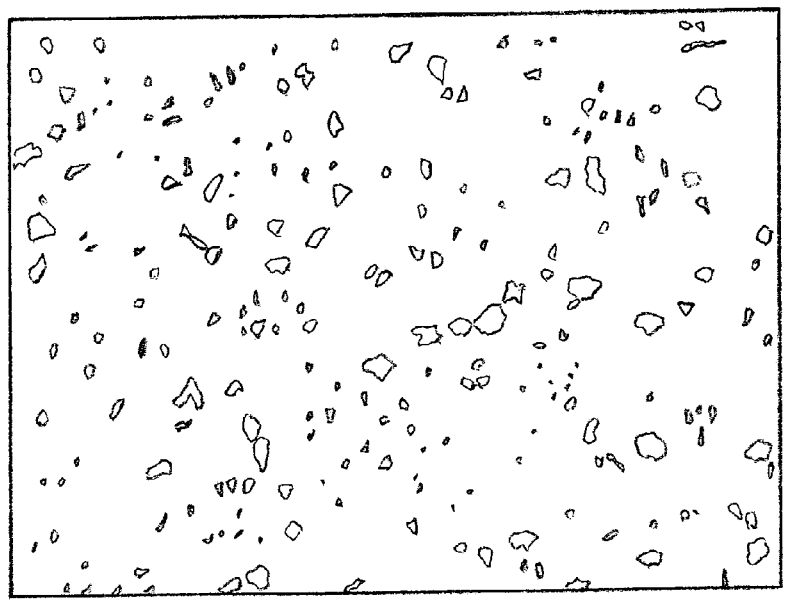
FIG. 3B is a photograph showing an observed surface of a low dielectric-constant insulating film formed as a sample for comparison by use of a deposition gas consisting of HMDSO+$N_2O$.

FIG. 3A is a photograph showing the observed surface of the low dielectric-constant insulating film 22 formed by the film forming method of this embodiment using the deposition gas consisting of $HMDSO+N_2O+Ar$; and FIG. 3B a photograph showing the observed surface of the low dielectric-constant insulating film formed as a comparative sample by use of the deposition gas consisting of $HMDSO+N_2O$.

As shown in the drawings, in the case of the sample formed by use of the deposition gas containing Ar for dilution, compared with the comparative sample, surface roughness was almost completely prevented.

Figure 4A:
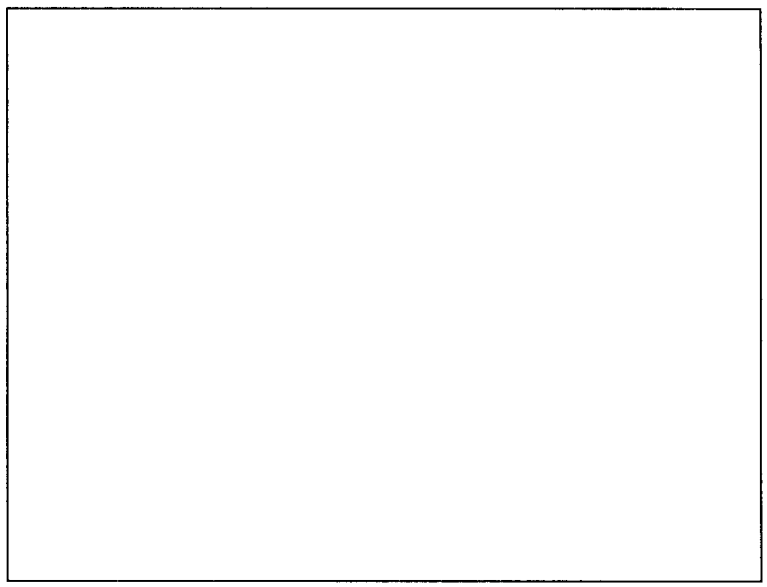
FIG. 4A is a photograph showing an observed surface of a low dielectric-constant insulating film formed by the film forming method of this embodiment by use of the deposition gas consisting of HMDSO+$N_2O$+Ar.
Figure 4B:
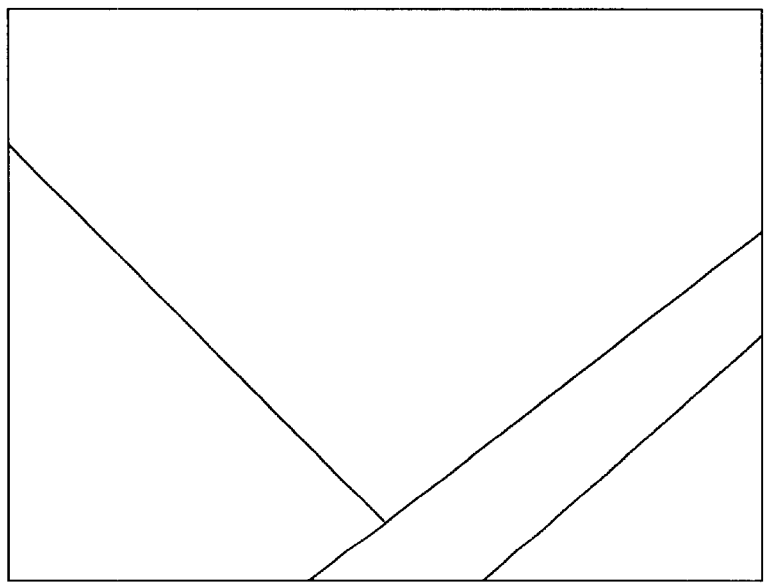
FIG. 4B is a photograph showing an observed surface of a low dielectric-constant insulating film formed as a sample for comparison by use of the deposition gas containing HMDSO+$N_2O$.

FIG. 4A is a photograph showing the observed surface of the low dielectric-constant insulating film formed by the film forming method of this embodiment by use of the deposition gas consisting of $HMDSO+N_2O+Ar$; and FIG. 4B a photograph showing the observed surface of the low dielectric-constant insulating film formed as a comparative sample by use of the deposition gas consisting of $HMDSO+N_2O$.

As shown in the drawings, in the case of the sample formed by use of the deposition gas containing Ar for dilution, compared with the comparative sample, generation of cracks was almost completely suppressed.

Then, an investigation was performed with respect to a film stress, a film density and a deposition speed of the insulating film formed by use of the deposition gas of $HMDSO+N_2O+Ar$. Further, a measurement was made with respect to refractive indexes of the three kinds of low dielectric-constant insulating films using different kinds of dilution gases. As shown in FIG. 8B, electrodes were formed on the three kinds of low dielectric-constant insulating films 22 for measurement of the relative dielectric constant, and investigated a relative dielectric constant for each of the three kinds of low dielectric-constant insulating films 22.

For measuring a refractive index, a He—Ne laser of 6338 Å was used with an ellipsometer. For measuring a film stress, an optical lever laser scanning system was used. For measuring a film density, an X-ray reflectmetry (XRR) was used. For measuring a relative dielectric constant, a C-V measuring method having a high-frequency signal of 1 MHz superposed on a DC bias was used.

Figure 5:
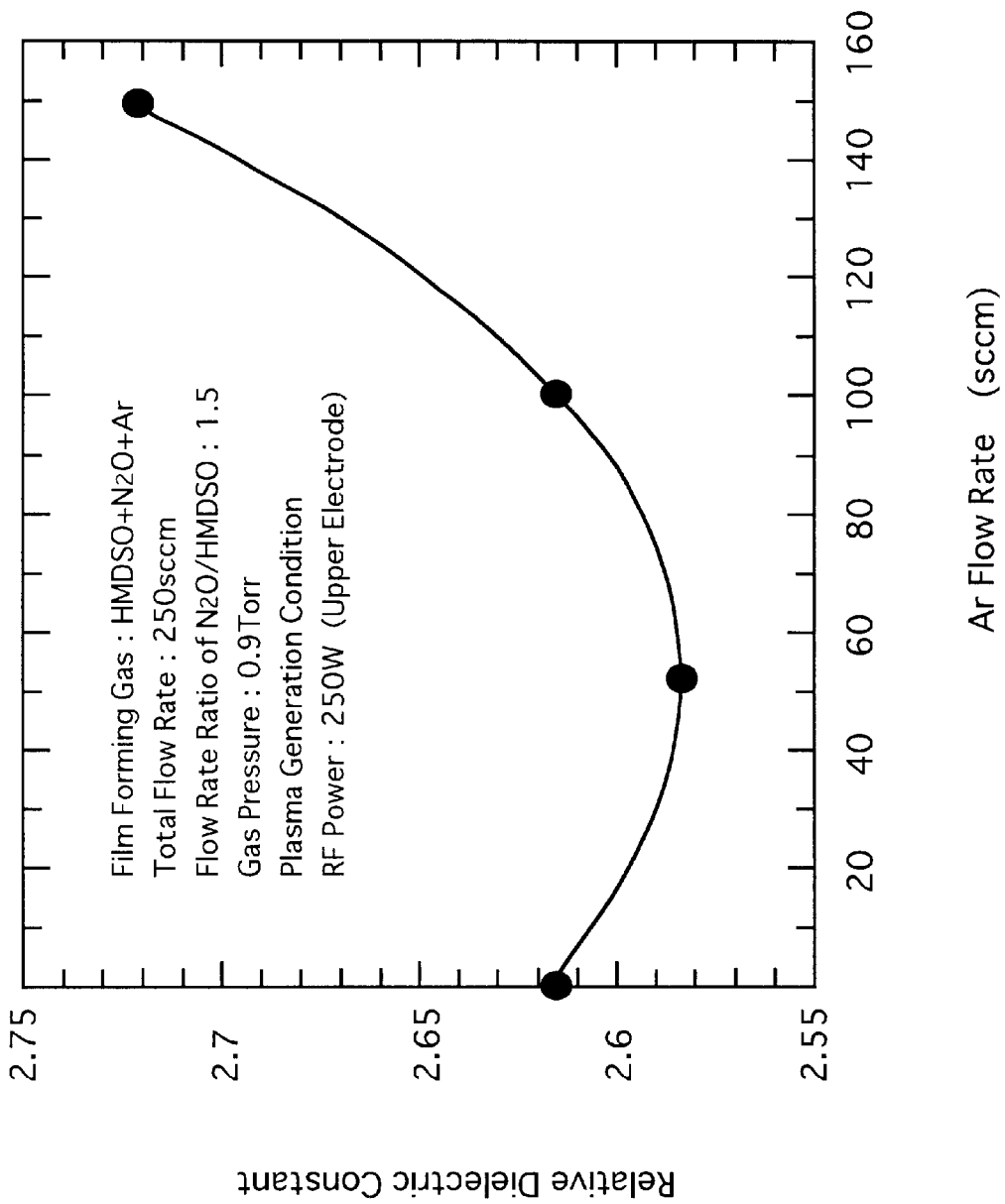
FIG. 5 is a graph showing a relation between a relative dielectric constant and an Ar flow rate regarding an insulating film formed by the film forming method of the embodiment of the present invention.
Figure 6:
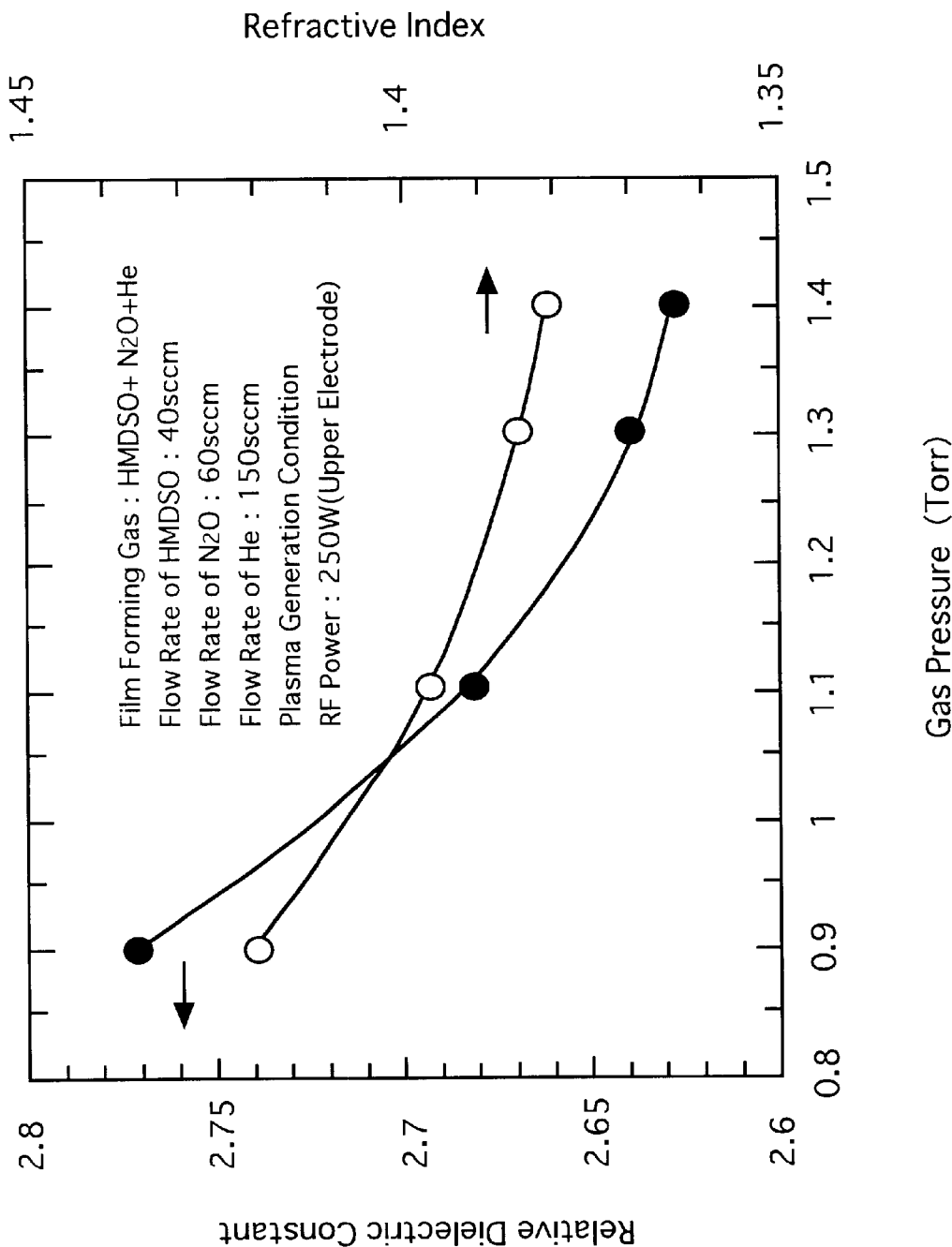
FIG. 6 is a graph showing relations between the relative dielectric constant and a gas pressure, and between a refractive index and the gas pressure, regarding the insulating film formed by the film forming method of the embodiment of the present invention.
Figure 7:
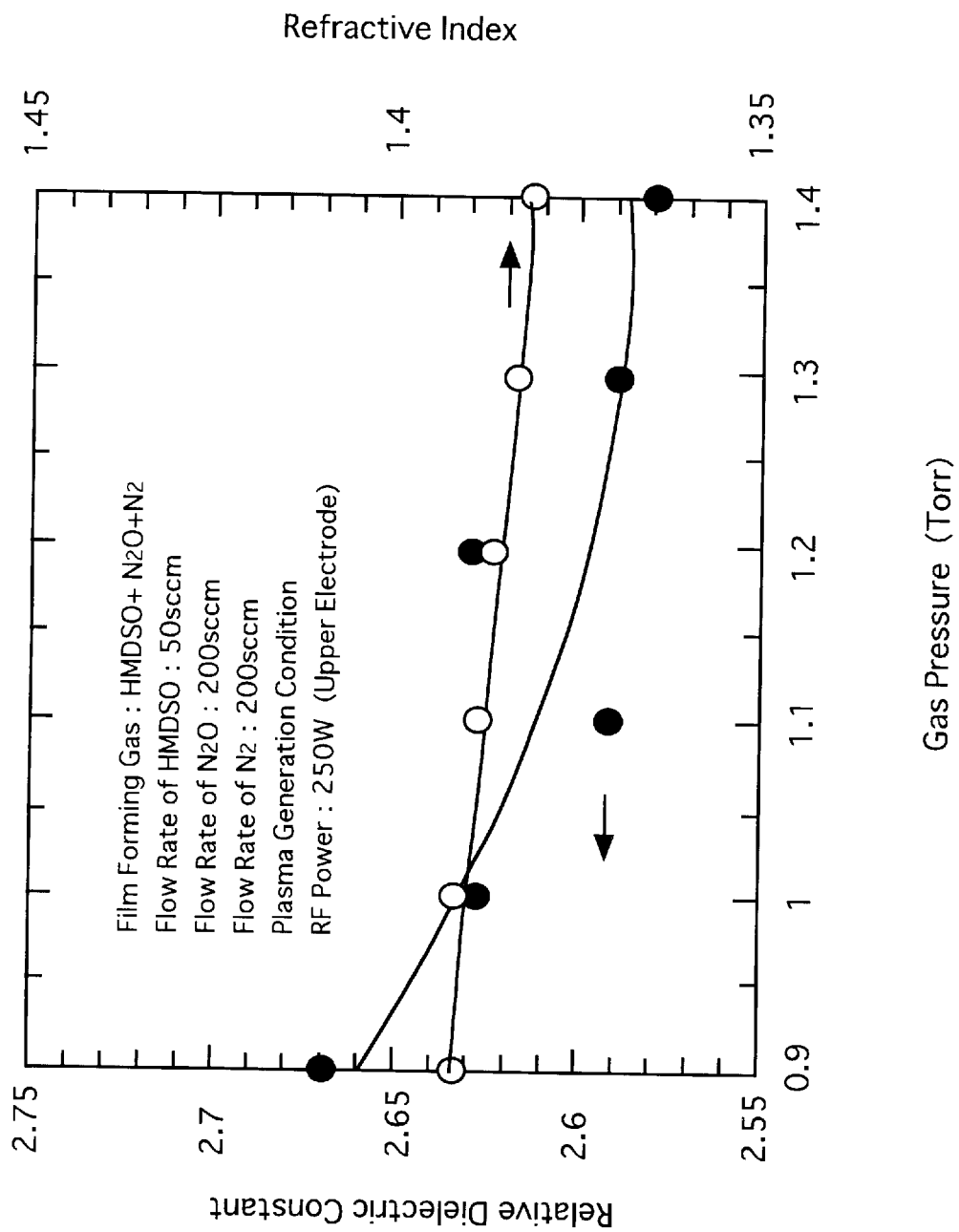
FIG. 7 is a graph showing relations between the relative dielectric constant and the gas pressure and between the refractive index and the gas pressure, regarding the insulating film formed by the film forming method of the embodiment of the present invention.

The measuring results of a relative dielectric constant and a refractive index are shown in each of FIGS. 5 to 7.

FIG. 5 is a graph showing a relation between a relative dielectric constant and an Ar flow rate regarding the low dielectric-constant insulating film formed by use of the deposition gas of $HMDSO+N_2O+Ar$. The ordinate represents a relative dielectric constant in linear scale; and the abscissa represents an Ar flow rate (sccm) in linear scale.

According to the result shown in FIG. 5, when no Ar was added, the relative dielectric constant was about 2.62, and became to have a minimum value, i.e., 2.59, at the Ar flow rate of 50 sccm. And, with the increase of the Ar flow rate, the relative dielectric constant became greater, reaching 2.72 at the Ar flow rate of 150 sccm. The relative dielectric constant of about 2.7 or lower was obtained at any Ar flow rate within the investigation range of 150 sccm or lower. Although investigation was not carried out, it is obvious that a relative dielectric constant of about 2.7 or lower can be obtained even at the Ar flow rate equal to or somewhat greater than 150 sccm.

Regarding the insulating film formed by use of the deposition gas of $HMDSO+N_2O+Ar$, the refractive index was 1.408, film stress $4.0 \times 10^8$ (dyne/cm$^2$), film density 1.3 (g/cm$^3$), and deposition speed 200 (nm/min.). This result was obtained under the film forming condition in Table 1, with an Ar flow rate of Z=50 sccm, HMDSO flow rate of 80 sccm, and $N_2O$ flow rate of 120 sccm.

FIG. 6 is a graph showing the relations between the relative dielectric constant and the gas pressure and between the refractive index and the gas pressure, regarding the low dielectric-constant insulating film formed by use of the deposition gas of $HMDSO+N_2O+He$. The left ordinate represents a relative dielectric constant in linear scale; the right ordinate represents a refractive index in linear scale; and the abscissa represents a gas pressure (Torr) in the chamber in linear scale.

According to the result shown in FIG. 6, when the gas pressure was 0.9 Torr, the relative dielectric constant was about 2.77. With the increase of the gas pressure thereafter, the relative dielectric constant became smaller, reaching about 2.64 when the gas pressure was 1.4 Torr. In any case, the relative dielectric constant of about 2.7 or lower was obtained in the investigation range of the gas pressure, i.e. from 0.9 to 1.4 Torr. Although investigation was not carried out, it is obvious that a relative dielectric constant of about 2.7 or lower can be obtained to some degree even when the gas pressure is 1.4 Torr or more or when the gas pressure is 0.9 Torr or lower.

Similarly, the refractive index measurement was carried out. When the gas pressure was 0.9 Torr, the refractive index was about 1.44. With the increase of the gas pressure thereafter, the refractive index became smaller, reaching about 1.36 when the gas pressure was 1.4 Torr.

FIG. 7 is a graph showing the relations between the relative dielectric constant and the gas pressure and between the refractive index and the gas pressure, regarding the low dielectric-constant insulating film formed by use of the deposition gas of $HMDSO+N_2O+N_2$. The left ordinate represents a relative dielectric constant in linear scale; the right ordinate represents a refractive index in linear scale; and the abscissa represents a gas pressure (Torr) in the chamber in linear scale.

According to the result shown in FIG. 7, when the gas pressure was 0.9 Torr, the relative dielectric constant was about 2.67. With the increase of the gas pressure thereafter, the relative dielectric constant became smaller, reaching about 2.58 when the gas pressure was 1.4 Torr. In any case, the relative dielectric constant of about 2.7 or lower was obtained in the investigation range of the gas pressure, i.e., from 0.9 to 1.4 Torr. Although investigation was not carried out, it is obvious that a relative dielectric constant of about 2.7 or lower can be obtained to some degree even when the gas pressure is 1.4 Torr or more or when the gas pressure is 0.9 Torr or lower.

Likewise, the refractive index measurement was carried out. When the gas pressure was 0.9 Torr, the refractive index was about 1.39. With the increase in the gas pressure thereafter, the refractive index became smaller, reaching about 1.38 when the gas pressure was 1.4 Torr.

As described above, according to the embodiment of the present invention, an insulating film is formed by PE-CVD by use of the deposition gas obtained by adding Ar, He or $N_2$ to the major deposition gas component consisting of siloxane and $N_2O$, and then diluting it. Thus, compared with the method of forming an insulating film similarly by PE-CVD by use of the deposition gas containing only siloxane and $N_2O$, it is possible to reduce the surface roughness of the insulating film more greatly, and suppress the generation of cracks in the insulating film more greatly.

The present invention is described in detail with reference to the embodiment. However, the scope of the present invention is not limited to the specific embodiment, and changes and modifications made without departing from the gist of the present invention are all within the scope of the present invention.

For example, in the embodiment, hexamethyldisiloxane (HMDSO) is used as siloxane. However, one of the other silicon compounds described above, e.g., octamethylcyclotetra siloxane (OMCTS) or tetramethylcyclotetrasiloxane (TMCTS) can be used.

Figure 9A:
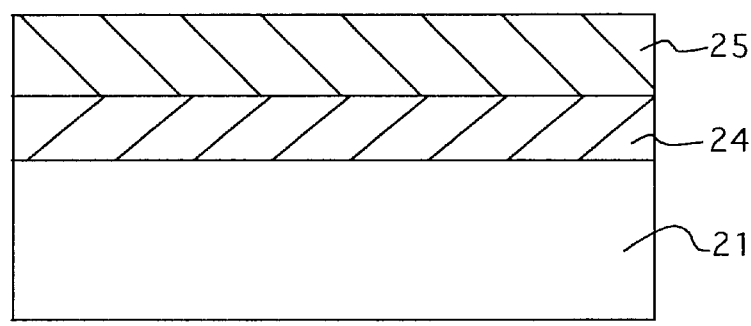
FIGS. 9A to 9C are sectional views (1), each showing one of various semiconductor devices using the insulating film formed by the film forming method of the embodiment of the present invention.
Figure 9B:
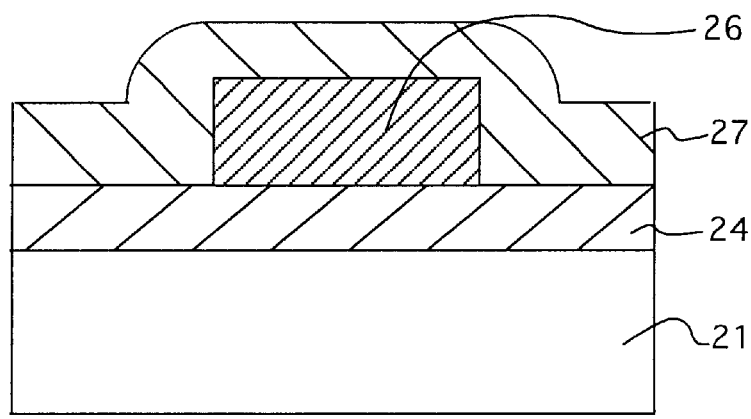
Figure 9C:
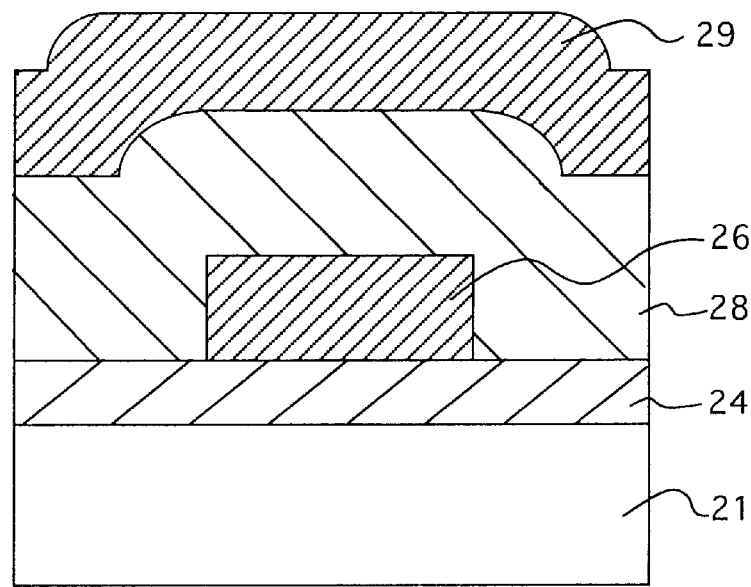
Figure 10A:
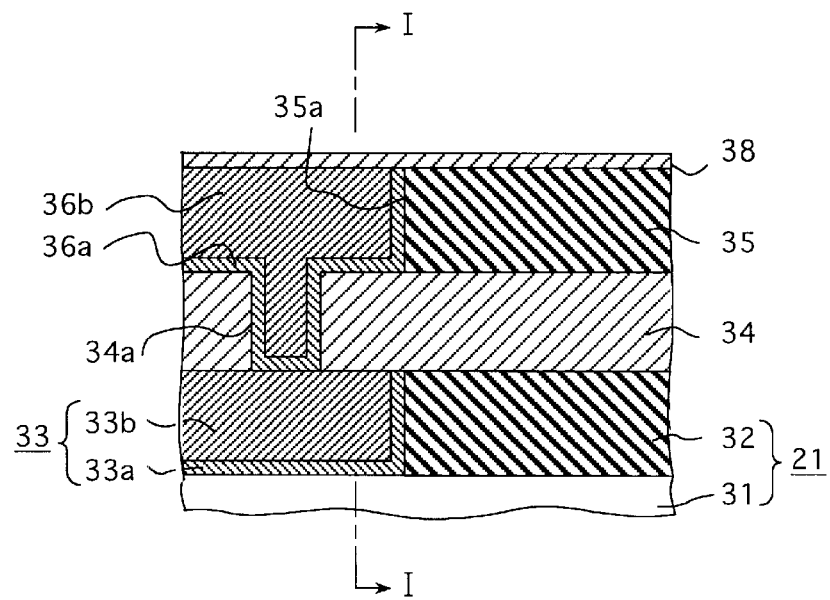
FIGS. 10A and 10B are sectional views (2), each showing one of the various semiconductor devices using the insulating film formed by the film forming method of the embodiment of the present invention.
Figure 10B:
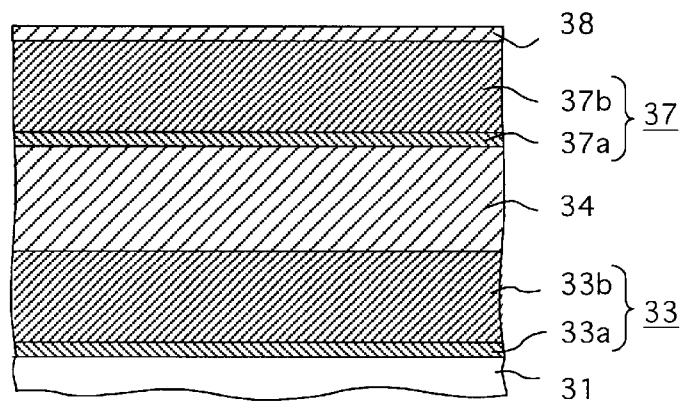

In the embodiment, a silicon substrate is used as a substrate targeted for film formation. However, alternative substrates may be used for the same purpose. For example as shown in FIG. 9A, a substrate with a base insulating film 24 exposed on the surface of the substrate can be used as a substrate targeted for the film formation, the base insulating film 24 being composed of a thermal oxidized film, a silicon oxide film formed by a CVD method, or a silicon-containing insulating film containing phosphorus or boron. Another example may be the one like that shown in FIG. 9B, where a wiring 26 made of aluminum, high melting-point metal or copper is formed on the base insulating film 24. In particular, since neither surface roughness nor crack generates in the insulating film of the present invention even when it is formed to be thick, it is advantageous to use the film of the present invention, as shown in FIG. 9C, as an interlayer insulating film 28 between lower and upper wirings 26 and 29. Another advantageous use of the insulating film of the present invention, as shown in FIGS. 10A and 10B, may be for an interlayer insulating film 34 between wirings 33 and 37 mainly made of a copper film, or for embedding insulating films 32 and 35. FIG. 10B is a sectional view taken on line I—I of FIG. 10A. In FIGS. 10A and 10B, a conductive substance with which a via-hole 34a is filled is a connecting conductor mainly made of a copper film for interconnecting the lower wiring 33 and upper wiring. The connecting conductor and the upper wiring are made of a TaN film 36a and a Cu film 36b, and the lower wiring 33 is made of a TaN film 33a and a Cu film 33b as well. An insulating film with which the upper wiring is covered is a protective insulating film 38.

What is claimed is:

1. A film forming method comprising the steps of:

adding at least one diluting gas selected from the group consisting of an inert gas and a nitrogen gas (N$_2$) to a major deposition gas consisting of siloxane and N$_2$O to form a resultant deposition gas;

converting the resultant deposition gas, consisting of siloxane, N$_2$O and the diluting gas, into plasma; and allowing the deposition gas converted into plasma to react, and thus forming an insulating film on a substrate targeted for film formation.

2. The film forming method according to claim 1, wherein the inert gas is at least one selected from the group consisting of argon (Ar) and helium (He).

3. The film forming method according to claim 1, wherein the siloxane is one selected from the group consisting of hexamethyldisiloxane (HMDSO: (CH$_3$)$_3$Si—O—Si(CH$_3$)$_3$), and octamethylcyclotetrasiloxane (OMCTS), tetramethylcyclotetrasiloxane (TMCTS), said OMCTS and TMCTS being respectively represented by chemical formulas 1 and 2 below:

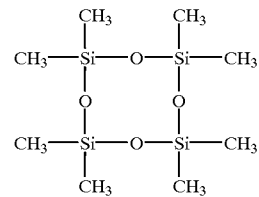

[Chemical Formula 1]

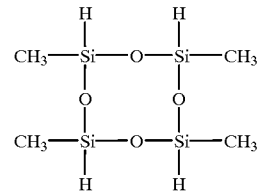

[Chemical Formula 2]

4. A method of manufacturing a semiconductor device, comprising the steps of:

providing a substrate as a target for film formation, the substrate having at least a base insulating film exposed thereon;

adding at least one diluting gas selected from the group consisting of an inert gas and a nitrogen gas (N$_2$) to a major deposition gas consisting of siloxane and N$_2$O to form a resultant deposition gas;

converting the resultant deposition gas, consisting of siloxane, N$_2$O and the diluting gas, into plasma; and allowing the deposition gas converted into plasma to react, and thus forming an insulating film on the substrate.

5. The manufacturing method of a semiconductor device according to claim 4, wherein the substrate targeted for film formation includes a wiring exposed therein, in addition to the base insulating film.

6. The manufacturing method of a semiconductor device according to claim 5, wherein a material for the wiring is at least one selected from the group consisting of aluminum, high melting-point metal and copper.

7. The manufacturing method of a semiconductor device according to claim 4, wherein the base insulating film is any one selected from the group consisting of a thermal oxidized film and an insulating film formed by a chemical vapor deposition.

8. A method of manufacturing a semiconductor device comprising the steps of:

providing a substrate as a target for film formation, the substrate having at least a base insulating film exposed thereon;

adding at least one diluting gas selected from the group consisting of an inert gas and a nitrogen gas (N$_2$) to a major deposition gas consisting of siloxane and N$_2$O to form a resultant deposition gas;

converting the resultant deposition gas, consisting of siloxane, N$_2$O and the diluting gas, into plasma;

allowing the deposition gas converted into plasma to react, and thus forming an insulating film on the substrate targeted for film formation;

forming a via hole or a wiring trench in the insulating film; and embedding a copper film in the via hole or the wiring trench to form a connecting conductor or a wiring.

9. The film forming method according to claim 1, wherein said step of converting the resultant deposition gas into plasma is performed by applying electric power between parallel arranged plate electrodes, one of the electrodes holding the substrate.

10. The film forming method according to claim 1, wherein total gas pressure of said major deposition gas and diluting gas is at least 0.9 Torr.

11. The manufacturing method according to claim 4, wherein said step of converting the resultant deposition gas into plasma is performed by applying electric power between parallel arranged plate electrodes, one of the electrodes holding the substrate.

12. The film forming method according to claim 4, wherein total gas pressure of said major deposition gas and diluting gas is at least 0.9 Torr.

13. The manufacturing method according to claim 8, wherein said step of converting the resultant deposition gas into plasma is performed by applying electric power between parallel arranged plate electrodes, one of the electrodes holding the substrate.

14. The film forming method according to claim 8, wherein total gas pressure of said major deposition gas and diluting gas is at least 0.9 Torr.

* * * * *